(12) United States Patent
Ahn et al.

(10) Patent No.: US 9,338,905 B2
(45) Date of Patent: May 10, 2016

(54) CURVED DISPLAY APPARATUS

(71) Applicant: SAMSUNG ELECTRONICS CO., LTD., Suwon-si (KR)

(72) Inventors: Jun-seok Ahn, Suwon-si (KR); Chan-hong Park, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 287 days.

(21) Appl. No.: 13/949,796

(22) Filed: Jul. 24, 2013

(65) Prior Publication Data

US 2014/0133073 A1    May 15, 2014

(30) Foreign Application Priority Data

Nov. 9, 2012   (KR) .................. 10-2012-0126733

(51) Int. Cl.
*H05K 5/02* (2006.01)
*G02F 1/1333* (2006.01)
*H05K 5/00* (2006.01)
(Continued)

(52) U.S. Cl.
CPC ........ *H05K 5/0217* (2013.01); *G02F 1/133305* (2013.01); *G02F 1/133308* (2013.01); *H01L 51/0097* (2013.01); *H01L 51/5237* (2013.01); *H05K 5/0017* (2013.01); *H05K 5/0221* (2013.01); *G02F 2001/133314* (2013.01); *G02F 2001/133317* (2013.01); *G02F 2201/465* (2013.01); *G02F 2202/28* (2013.01); *Y02E 10/549* (2013.01)

(58) Field of Classification Search
CPC ... G06F 1/1652; G06F 1/1616; G06F 1/1601; G06F 1/1681; G06F 1/1626; G06F 1/1637; G06F 1/181; G06F 3/0488; G06F 1/16; G06F 1/203; H05K 2201/10136; H05K 5/0017; H05K 5/02; H05K 5/0217; H05K 7/14; H05K 5/0221; G02F 1/133305; G02F 1/33308; G02F 2001/133314; G02F 2001/133317; G02F 2001/465; G02F 2002/28; H01L 51/0097; H01L 51/5237; Y02E 10/549
USPC ............ 361/679.01, 679.02, 679.21, 679.26, 361/679.27, 679.55–679.58; 349/64, 106; 345/173
See application file for complete search history.

(56) References Cited

U.S. PATENT DOCUMENTS

| | | | |
|---|---|---|---|
| 5,666,261 | A | 9/1997 | Aguilera |
| 7,190,503 | B2 | 3/2007 | Ide |
| 7,586,580 | B2 | 9/2009 | Matsuda et al. |

(Continued)

FOREIGN PATENT DOCUMENTS

| | | |
|---|---|---|
| EP | 2 312 563 A1 | 4/2011 |
| JP | 7-140451 A | 6/1995 |

(Continued)

OTHER PUBLICATIONS

Communication dated May 9, 2014, issued by the European Patent Office in counterpart European Application No. 13192184.3.

(Continued)

*Primary Examiner* — Anthony Haughton
*Assistant Examiner* — Ingrid Wright
(74) *Attorney, Agent, or Firm* — Sughrue Mion, PLLC

(57) ABSTRACT

A curved display apparatus is provided. The curved display apparatus includes a fixing member which is curved; and a display panel which is attached to the fixing member and curved along the fixing member.

13 Claims, 19 Drawing Sheets

(51) Int. Cl.
*H01L 51/00* (2006.01)
*H01L 51/52* (2006.01)

(56) References Cited

U.S. PATENT DOCUMENTS

| | | |
|---|---|---|
| 7,667,786 B2 | 2/2010 | Nouchi et al. |
| 7,831,727 B2 | 11/2010 | Brodersen et al. |
| 7,920,223 B2 | 4/2011 | Nishizawa et al. |
| 8,139,177 B2 | 3/2012 | Nishizawa |
| 8,462,289 B2 | 6/2013 | Nishizawa et al. |
| 2006/0158897 A1 | 7/2006 | Choi et al. |
| 2009/0015747 A1 | 1/2009 | Nishizawa et al. |
| 2009/0091681 A1 | 4/2009 | Nishizawa et al. |
| 2009/0096965 A1 | 4/2009 | Nagata |
| 2009/0122223 A1 | 5/2009 | Hayano et al. |
| 2010/0033648 A1 | 2/2010 | Kaganezawa |
| 2011/0019129 A1 | 1/2011 | Nishizawa et al. |
| 2011/0096262 A1 | 4/2011 | Kikuchi |
| 2011/0255039 A1 | 10/2011 | Enomoto |
| 2012/0154707 A1* | 6/2012 | Hsieh et al. ............ 349/60 |
| 2014/0009914 A1* | 1/2014 | Cho et al. ............ 362/97.3 |

FOREIGN PATENT DOCUMENTS

| | | |
|---|---|---|
| JP | 9-258176 A | 10/1997 |
| JP | 10-268270 A | 10/1998 |
| JP | 2009-20168 A | 1/2009 |
| WO | 2009/006380 A2 | 1/2009 |

OTHER PUBLICATIONS

Communication dated Feb. 7, 2014 issued by the European Patent Office in counterpart European Patent Application No. 13192184.3.
Written Opinion (PCT/ISA/237) dated Mar. 19, 2014 issued by the International Searching Authority in International Application No. PCT/KR2013/009989.
International Search Report (PCT/ISA/210) dated Mar. 19, 2014 issued by the International Searching Authority in International Application No. PCT/KR2013/009989.

* cited by examiner

370

CURVED DISPLAY APPARATUS

CROSS-REFERENCE TO RELATED APPLICATION

This application claims priority from Korean Patent Application No. 10-2012-0126733, filed on Nov. 9, 2012, in the Korean Intellectual Property Office, the disclosure of which is incorporated herein by reference in its entirety.

BACKGROUND

1. Field

Methods and apparatuses consistent with exemplary embodiments relate to a curved display apparatus, and more particularly, to a curved display apparatus with curved supports that support a display panel causing the display panel to have curvature.

2. Description of the Related Art

As the screen size of a liquid crystal display (LCD) is becoming larger, a television (TV) using the LCD as a display apparatus is also becoming larger. The size of the LCD used in such a TV is generally about 40-60 inches, and, in recent years, supersized TVs, which employ an 80 inch LCD, are also being mass produced.

However, as the screen of the TV is becoming larger, there is a problem in that a difference between a visual angle when a viewer is viewing a center of the screen and a visual angle when the viewer is viewing left and right ends of the screen increases.

That is, when the viewer views an image displayed on the screen at a location corresponding to the center of the large size TV, the viewer can clearly recognize the image of the center of the screen. However, when the viewer's visual line moves to the left or right side, the screen appears blurred or unclear due to light that is reflected from the screen because of ambient lighting.

SUMMARY

One or more exemplary embodiments may overcome the above disadvantages and other disadvantages not described above. However, it is understood that one or more exemplary embodiment are not required to overcome the disadvantages described above, and may not overcome any of the problems described above.

One or more exemplary embodiments provide a curved display apparatus which has a front surface curved inwardly so that a display panel has a predetermined curvature.

According to an aspect of an exemplary embodiment, there is provided a curved display apparatus including: a fixing member which is curved; and a display panel which is attached to the fixing member and curved along the fixing member.

The fixing member may include: a bottom chassis which is curved; and a molding member which is connected with the bottom chassis in a curved state and to which the display panel is attached.

The display panel may be attached to the molding member using an adhesive. In this case, the adhesive comprises a double-sided tape may be disposed between the display panel and the molding member.

The display panel may be detachable from with the molding member.

The display panel may include a plurality of locking members which are formed along an edge of a rear surface of the display panel, and the molding member may include a plurality of connection protrusions which are detachably connected with the plurality of locking members, respectively.

The display panel may include a plurality of hook members which are formed along an edge of a rear surface of the display panel, and the molding member may include a plurality of connection recesses to which the plurality of hook members are respectively snap-fitted.

The molding member or the bottom chassis may include a plurality of fixing protrusions which are attached to an edge of the display panel. In this case, the plurality of fixing protrusions may be arranged along the edge of the display panel at intervals.

The molding member may be flexible.

A shape reinforcing structure may be connected with the bottom chassis in order to prevent the curvature of the bottom chassis from being deformed. The shape reinforcing structure may be a core which has a honey comb structure or a corrugation structure fixed to a bottom of the bottom chassis. In this case, the shape reinforcing structure may further include a cover member to cover the core.

The curved display apparatus may further include a top chassis which is connected to the bottom chassis and hides an edge of a top surface of the display panel.

The fixing member may be formed with a single curvature or multiple curvatures.

The display panel may be maintained with a single curvature or multiple curvatures.

The display panel may be an LCD panel or an OLED panel.

The display panel may be arranged in a landscape arrangement or a portrait arrangement.

The display panel may be flexible.

BRIEF DESCRIPTION OF THE DRAWING FIGURES

The above and/or other aspects will be more apparent by describing in detail exemplary embodiments, with reference to the accompanying drawings, in which.

DETAILED DESCRIPTION OF EXEMPLARY EMBODIMENTS

Figure 1:
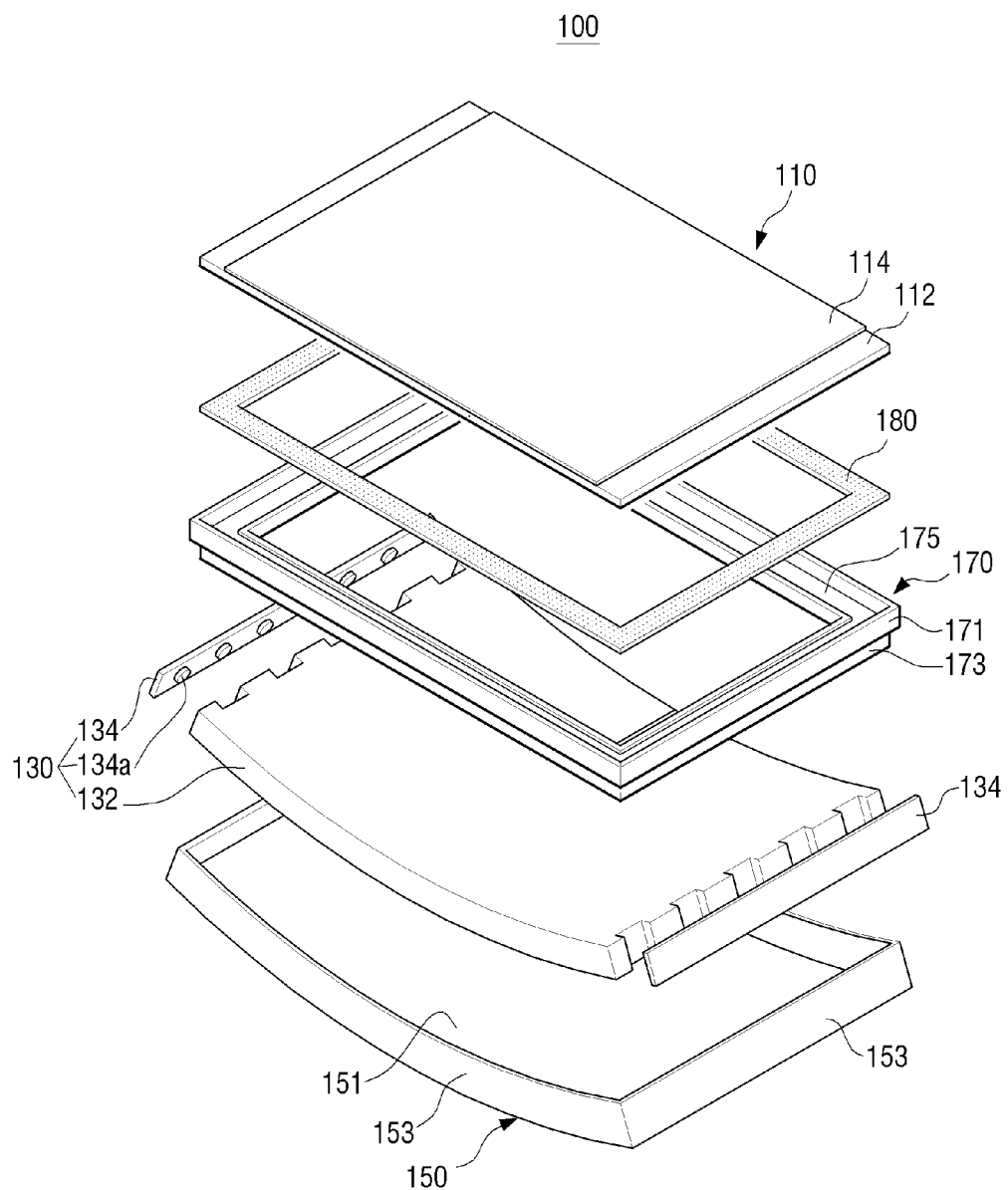
FIG. 1 is an exploded perspective view illustrating a curved display apparatus according to an exemplary embodiment.

Hereinafter, exemplary embodiments will be described in greater detail with reference to the accompanying drawings.

In the following description, same reference numerals are used for the same elements when they are depicted in different drawings. The matters defined in the description, such as detailed construction and elements, are provided to assist in a comprehensive understanding of exemplary embodiments. Thus, it is apparent that exemplary embodiments can be carried out without those specifically defined matters. Also, functions or elements known in the related art are not described in detail since they would obscure the exemplary embodiments with unnecessary detail.

Hereinafter, a curved display apparatus according to various exemplary embodiments will be explained in detail with reference to the accompanying drawings.

A curved display apparatus 100 according to an exemplary embodiment will be explained below with reference to FIGS. 1 to 2B.

Figure 2A:
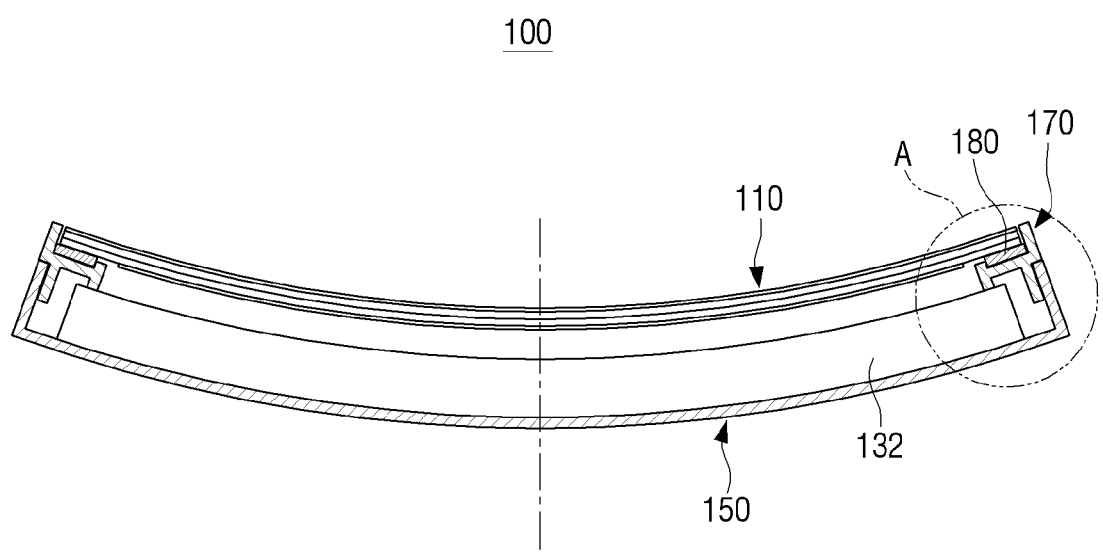
FIG. 2A is a cross section view of the curved display apparatus of FIG. 1 in an assembled state.

FIG. 1 is an exploded perspective view illustrating a curved display apparatus 100 according to an exemplary embodiment. In particular, a concavely curved display apparatus 100 having a landscape orientation and a direct type backlight assembly is illustrated. FIG. 2A illustrates a cross section of the curved display apparatus 100 of FIG. 1 in an assembled state, and FIG. 2B is an enlarged view of a part "A" of FIG. 2A. In FIGS. 2A and 2B, light sources 134a and a printed circuit board (PCB) 134 on which the light sources 134a are mounted are omitted for the convenience of explanation.

Referring to FIG. 1, the curved display apparatus 100 includes a display panel 110, an edge type backlight assembly 130, a bottom chassis 150, and a molding member 170.

A display member may include display panel 110 and the edge type backlight assembly 130. The curved display apparatus 100 of FIG. 1 may be used as a large or medium size curved display apparatus such as a monitor for a computer, or may be used as a large size display apparatus having a large screen such as a large size television. Also, the display panel 110 may be a liquid crystal display (LCD) panel for example, but is not limited thereto. An organic light emitting diode (OLED) panel having flexibility like the LCD panel may be used.

The display panel 110 may include an array substrate 112, a color filter substrate 114 which faces the array substrate 112, and a liquid crystal layer (not shown) which are interposed between the array substrate 112 and the color filter substrate 114. The color filter substrate 114 has a size smaller than that of the array substrate 112. Accordingly, an area that is not covered by the color filter substrate 114 is exposed. A pad unit may be disposed on the exposed area.

The array substrate 112 is a substrate in which thin film transistors (TFTs), which are switching elements, are disposed in a matrix pattern. The TFTs have a source terminal and a gate terminal to which a data line and a gate line are connected, respectively, and have a drain terminal to which a pixel electrode made of a transparent conductive material is connected. A data pad unit which is extended from the data line is disposed on a non-displayed area of the array substrate 112. Although not shown, a gate pad unit which is extended from the gate line may further be disposed.

The color filter substrate 114 is a substrate that is disposed opposite the array substrate 112 and on which RGB pixels for reproducing colors are disposed in a thin film form. A common electrode, which is made of a transparent conductive material, is disposed on the color filter substrate 144 to face the pixel electrode disposed on the array substrate 112.

The display panel 110 may include an array substrate on which a color filter is disposed, and a facing substrate on which a common electrode facing the array substrate is disposed.

If power is supplied to the gate terminal of the TFT of the display panel 110 and the TFT is turned on, an electric field is generated between the pixel electrode and the common electrode. Liquid crystal arrangement of the liquid crystal layer which is disposed between the array substrate 112 and the color filter substrate 114 is changed because of the electric field, and light transmittance is changed according to the change in the liquid crystal arrangement such that an image of desirable gradation is displayed.

The display panel 110 may further include a first polarizing film 116 which is disposed on a lower portion of the array substrate 112, and a second polarizing film 118 which is disposed on an upper portion of the color filter substrate 114. The first polarizing film 116 includes a transmission axis of a first direction and polarizes light in the first direction. The second polarizing film 118 includes a transmission axis of a second direction and polarizes light in the second direction. For example, the transmission axis of the first polarizing film 116 and the transmission axis of the second polarizing film 118 are perpendicular to each other.

The edge type backlight assembly 130 is disposed under the display panel 110 and provides light to the display panel 110. One of a direct type backlight assembly and an edge type backlight assembly may be employed in the present disclosure, and the edge type backlight assembly 130 may be employed by way of an example. The direct type backlight assembly has a plurality of light sources arranged on a bottom surface of a diffusion plate (not shown), and allows light to enter a rear surface of the display panel 110.

The edge type backlight assembly 130 includes a plurality of light sources 134a which are arranged on side surfaces of a light guide plate 132 opposite to one another, and a plurality of optical sheets (not shown) which are arranged between the display panel 110 and the light guide plate 132.

The edge type backlight assembly 130 converts line light or point light which enters from the light sources through the light guide plate 132 into planar light, and guides the planar light toward the rear surface of the display panel 110 through the optical sheets (not shown).

The optical sheets (not shown) are arranged on an upper portion of the light guide plate 132 and improve efficiency of light entering from the light guide plate 132. The optical sheets may include a diffusion sheet which diffuses light which has been diffused by the light guide plate 132 again, and a prism sheet which collects the light diffused by the diffusion sheet on a front surface. For example, the prism sheet may include a vertical prism sheet to collect light in a vertical direction, and a horizontal prism sheet to collect light in a horizontal direction.

Figure 2B:
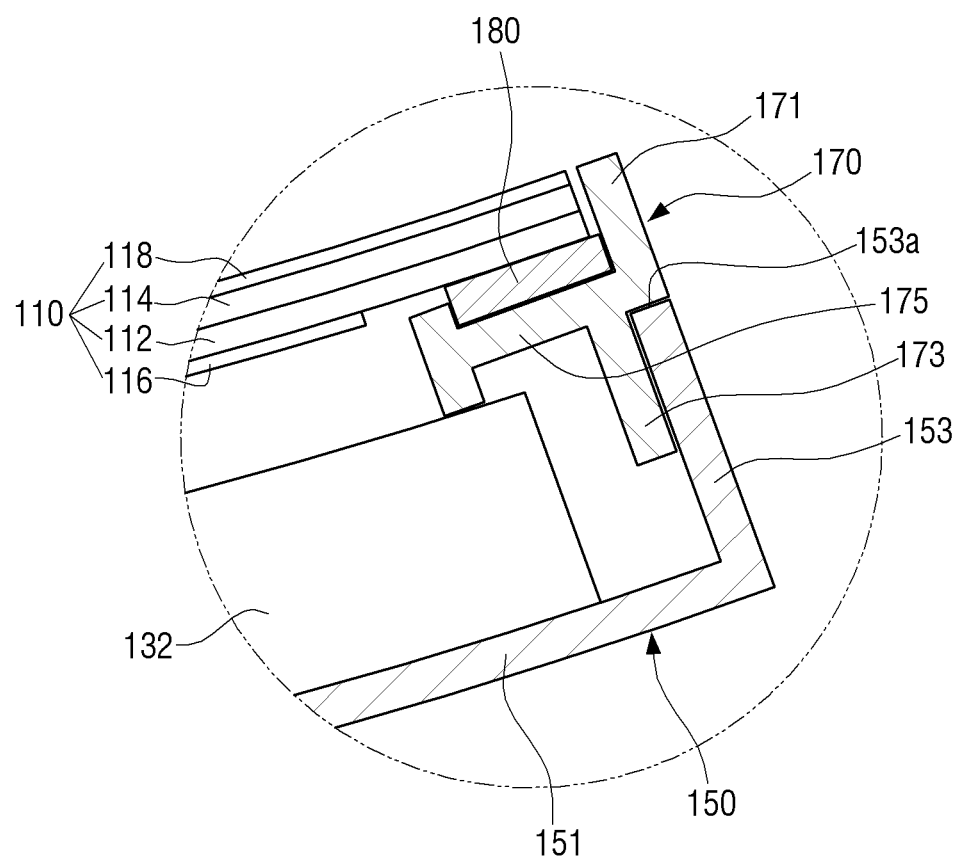
FIG. 2B is an enlarged view of a part "A" of FIG. 2A.

Referring to FIG. 2B, the bottom chassis 150 includes a bottom wall 151 and side walls 153 which are extended from edges of the bottom wall 151 and form a receiving space. The bottom chassis 150 is disposed under the display panel 110 and may receive a reflecting plate, the light guide plate 132, the PCB 134 on which the light sources 134a are mounted, and the optical sheets (not shown). The light sources 134a are arranged on one side surface of the PCB 134 at intervals, and a pair of the PCBs 134 may be provided and may be disposed on opposite side surfaces of the side walls 153 of the bottom chassis 150.

The bottom chassis 150 guides the display panel 110 to maintain predetermined curvature, and may be made of metal or synthetic resin having predetermined stiffness to prevent deformation of curvature. In this case, the bottom chassis 150 may guide the display panel 110 so that the entire display panel 110 has a single curvature or the display panel 110 has multiple curvatures which are different according to a predetermined section of the display panel 110. The multiple curvatures may be formed so that curvature at a left or right side of the display panel 110 is smaller than that at a center of the display panel 110 like a parabola.

The bottom chassis 150 may be curved concavely as viewed from a viewer so that the display panel 110 has a single curvature or multiple curvatures as described above.

The molding member 170 is disposed between the display panel 110 and the bottom chassis 150. A fixing member may include one or more of the molding member 170 and the bottom chassis 150. The molding member 170 supports the display panel 110 and also fixes the optical sheets and the light guide plate 132 to the bottom chassis 150.

The molding member 170 includes a first part 171 which has a shape substantially corresponding to an exterior of the side wall 153 of the bottom chassis 150, a second part 173 which is extended from a lower end of the first part 171 by a predetermined length, and a support rib 175 which is formed inwardly from the first part 171.

The first part 171 is disposed along a top end 153a of the side walls 153 of the bottom chassis 150, and the second part 171 is disposed along an inner side surface of the side walls 153 of the bottom chassis 150. In this case, the second part 173 of the molding member 170 and the side walls 153 of the bottom chassis 150 are fixed to each other by a plurality of fasteners (for example, screws or bolts), or may be bonded to each other by an adhesive or a double-sided tape.

The support rib 175 protrudes inward by a predetermined length from a part that substantially corresponds to a boundary between the first part 171 and the second part 173. An end of the support rib 175 supports the light guide plate 132, and simultaneously, an adhesive member 180 is attached to a top surface of the support rib 175 facing the display panel 110.

The molding member 170 is made of a material having predetermined stiffness and also having flexibility. Therefore, the molding member 170 does not have substantial curvature prior to being connected with the bottom chassis 150, and is curved in a shape corresponding to the curvature of the bottom chassis 150 when being connected with the bottom chassis 150 by a predetermined fastener (not shown).

The display panel 110 may be fixed to the molding member 170, which is curved according to the curvature of the bottom chassis 150, through the adhesive member 180 (for example, a double-sided tape having adhesives on both sides). The display panel 110 fixed to the molding member 170 is curved along with the molding member 170 to have curvature corresponding to the curvature of the bottom chassis 150.

As described above, in the curved display apparatus 100, the flat type display panel 110 is pulled toward the molding member 170 by the adhesive member 180 as shown in FIG. 1, such that the curvature corresponding to the curvature of the bottom chassis 150 is continuously maintained as shown in FIG. 2A.

Figure 3:
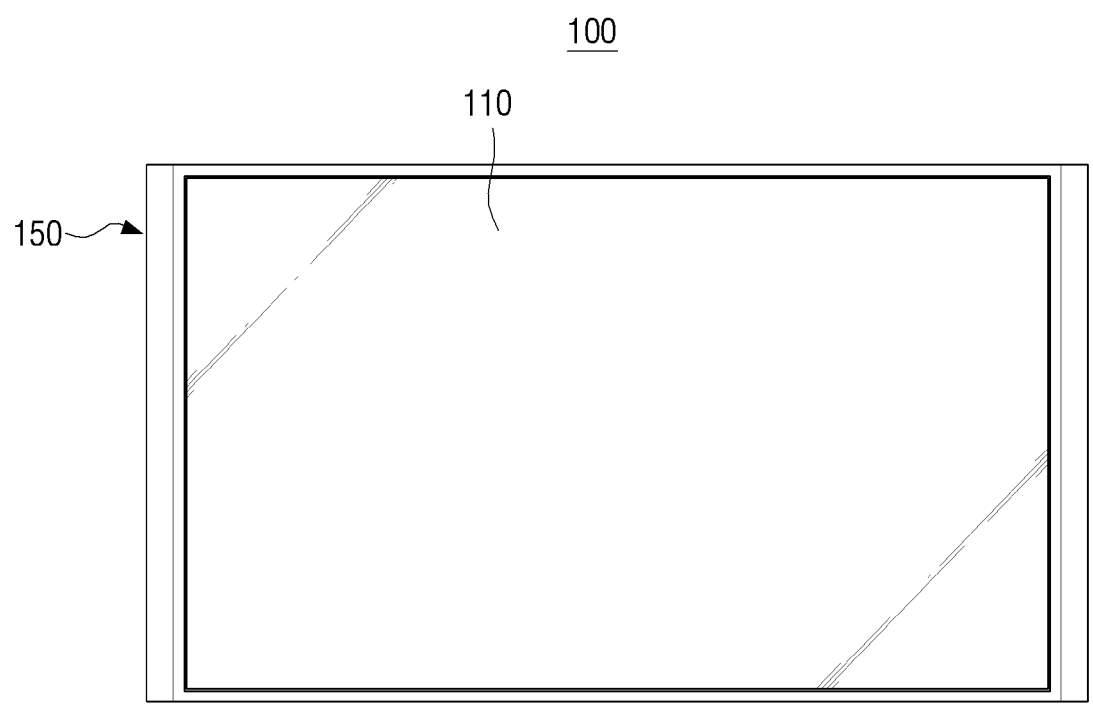
FIG. 3 is a view illustrating a front surface of the curved display apparatus of FIG. 2A.

Referring to FIG. 3, a top chassis (bezel) may be omitted from the curved display apparatus 100. FIG. 3 illustrates the curved display apparatus 100 as viewed from the front side. If a driving PCB to drive the display panel 110 is a chip on glass (COG) type, it is appropriate to omit the bezel. That is, since the sizes of the array substrate 112 and the color filter substrate 114 of the display panel 110 are the same in the case of the driving PCB of the COG type, a stepped part is not formed on an end of the display panel 110 for soldering a terminal, unlike in a driving PCB of a chip on film (COF). In other exemplary embodiments, which will be described below, a display panel 110 applying the driving PCB of the COF type is employed and thus a top chassis (bezel) for hiding a stepped part of the display panel 110 is provided.

Although the molding member 170 is made of a flexible material that is deformable according to the curvature of the bottom chassis 150 as described above, the molding member 170 is not limited thereto. The molding member 170 may be made of a rigid material having predetermined rigidity without flexibility. In this case, the molding member 170 may be molded to have curvature corresponding to the curvature of the bottom chassis 150.

Figure 4:
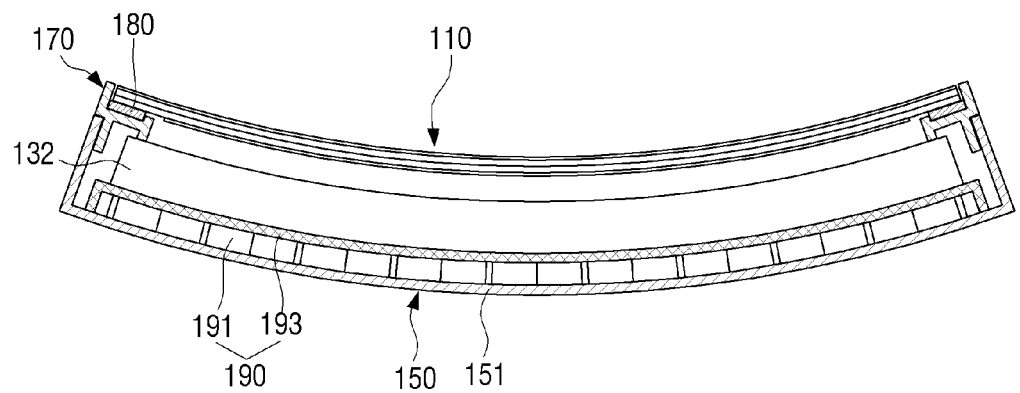
FIGS. 4 and 5 are cross section views illustrating examples of strength reinforcing members of different shapes which are disposed in the curved display apparatus according to an aspect of an exemplary embodiment.

Referring to FIG. 4, the curved display apparatus 100 according to an exemplary embodiment may further include a shape reinforcing member 190 to prevent the curvature of the bottom chassis 150 from being deformed.

The shape reinforcing member 190 may include a core 191 and a cover member 193 to cover the core 191.

The core 191 is attached along an inner side of the bottom wall 151 of the bottom chassis 150. The core 191 may be attached by an adhesive such as a hot melt adhesive. The core 191 may have a structure that is divided into a plurality of spaces to maintain optimal strength and reduce weight, for example, a honey-comb structure. In this case, each cell of the core 191 is not limited to the honey-comb structure and may be changed to a rectangular or circular structure.

Figure 5:
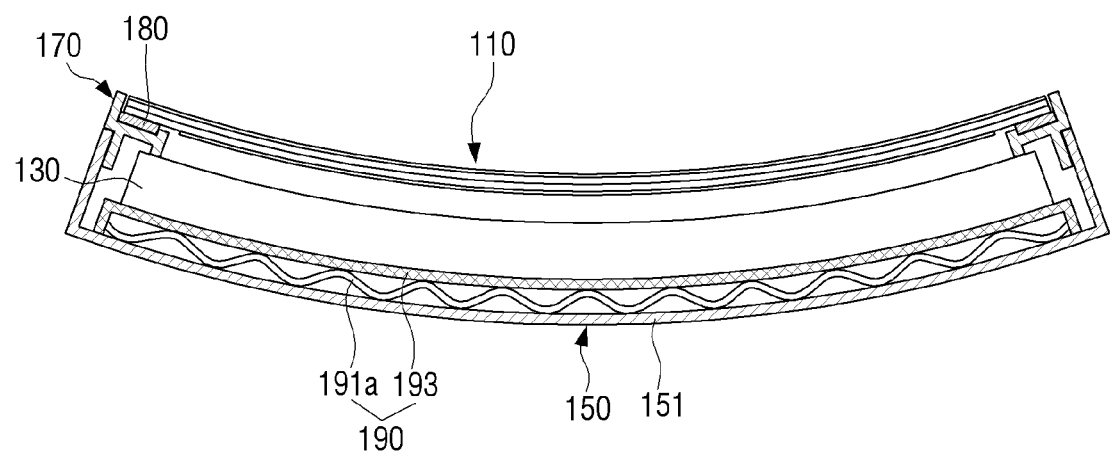

Also, as shown in FIG. 5, a core 191a may have a corrugation structure.

The core 191 or 191a may be made of aluminum having a predetermined strength, but should not be considered as limiting. The core 191 or 191a may be made of other metals or non-metallic materials (for example, plastic).

The cover member 193 may cover the core 191 or 191a to prevent the core 191, 191a from being exposed. The cover member 193 may be made of the same material as that of the core 191 or 191a. Accordingly, the cover member 193 may be made of aluminum. The cover member 193 is attached to the core 191 or 191a, and may be attached to the core 191 or 191a of an adhesive such as a hot melt adhesive. The cover member 193 covers the core 191, 191a such that contaminants on the core 191 or 191a are prevented from entering the display panel 110.

As described above, since the shape reinforcing member 190 is mounted in the bottom chassis 150, the curved display apparatus 100 may reinforce the strength of the bottom chassis 150 and may minimize shape deformation of the bottom chassis 150.

Although the shape reinforcing member 190 may include the core 191 or 191a and the cover member 193, this should not be considered as limiting. The cover member 193 may be omitted and only the core 191 or 191*a* may be provided.

Figure 6A:
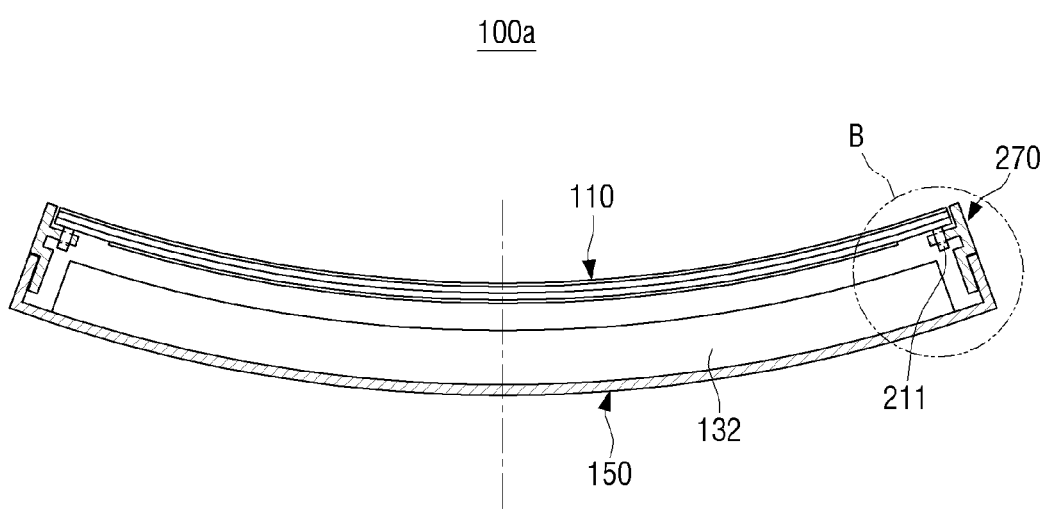
FIG. 6A is a cross section view illustrating a curved display apparatus according to an aspect of another exemplary embodiment.

Hereinafter, a curved display apparatus 100*a* according to another exemplary embodiment will be explained with reference to FIGS. 6A to 9. FIG. 6A is a cross section view illustrating a curved display apparatus according to another exemplary embodiment, and FIG. 6B is an enlarged view of a part "B" of FIG. 6A.

Most of the elements of the curved display apparatus 100*a* are similar to those described with reference to FIG. 2A. However, the curved display apparatus 100*a* differs from the curved display apparatus 100 in the structure for fixing the display panel 110. Therefore, the structure for fixing the display panel 110, which is different from that of FIG. 2A will be explained. The same elements as those of FIGS. 2A-5 use the same reference numerals and a detailed description thereof is omitted.

Referring to FIG. 6A, a molding member 270 is disposed between the display panel 110 and the bottom chassis 150, and is made of a material having predetermined stiffness and also having flexibility. Therefore, if the molding member 270 is connected with the bottom chassis 150 by a fastener, the molding member 270 may be curved in a shape corresponding to curvature of the bottom chassis 150.

Figure 6B:
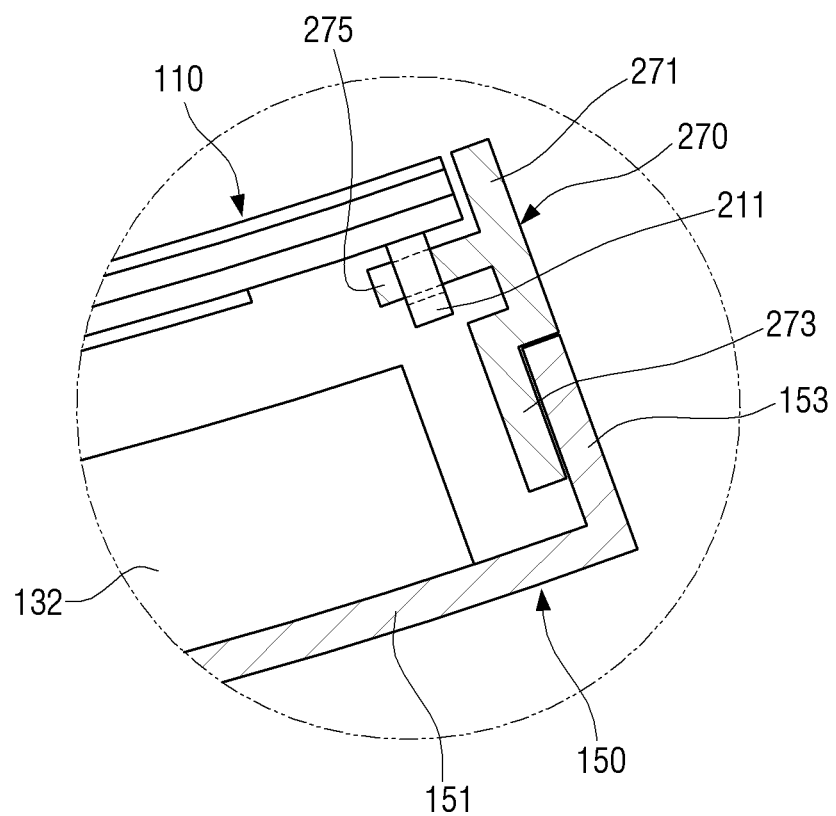
FIG. 6B is an enlarged view illustrating a part "B" of FIG. 6A.

Referring to FIG. 6B, the molding member 270 includes a first part 271 which has a shape substantially corresponding to an exterior of the bottom chassis 150, and a second part 273 which is extended from a lower end of the first part 271 by a predetermined length. In this case, although a support rib for supporting the light guide plate 132 in the molding member 270 is not illustrated in FIG. 6B, the support rib may be extended along an inner side of the molding member 270.

Figure 7:
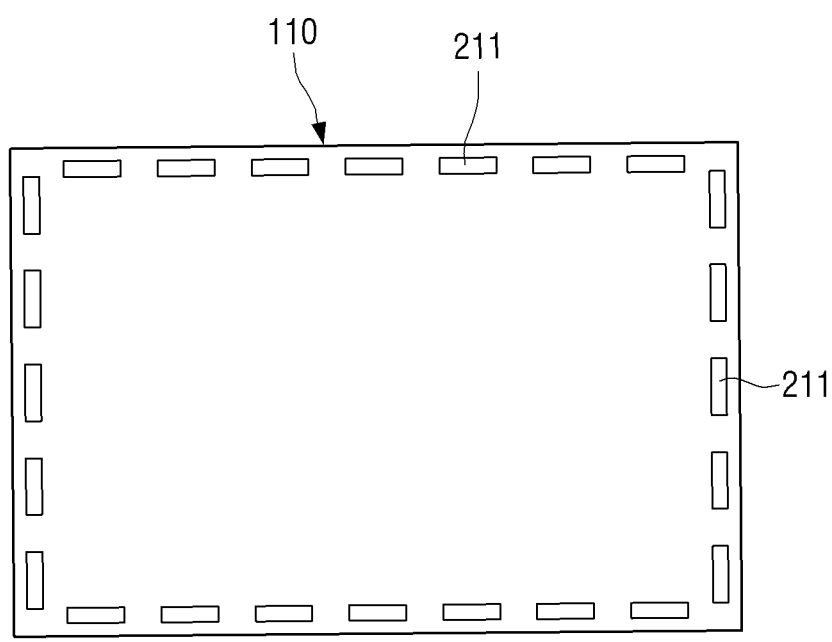
FIG. 7 is a view illustrating a rear surface of the display apparatus of FIG. 6A.

Referring to FIG. 7, the molding member 270 may include a plurality of connection protrusions 275 which protrude along an inner side of the first part 271 at intervals.

Figure 8:
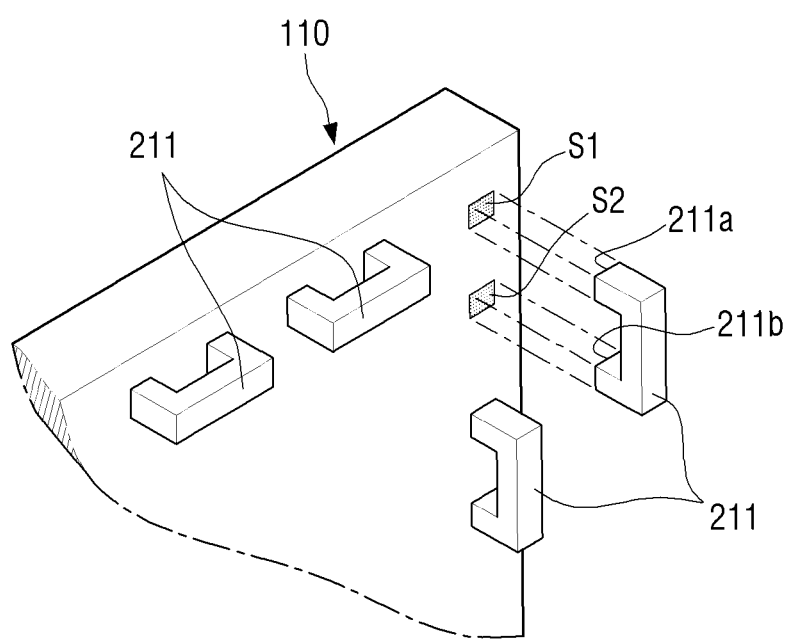
FIG. 8 is a view illustrating a plurality of locking members of FIG. 6A, which are fixed to the rear surface of the display panel.
Figure 9:
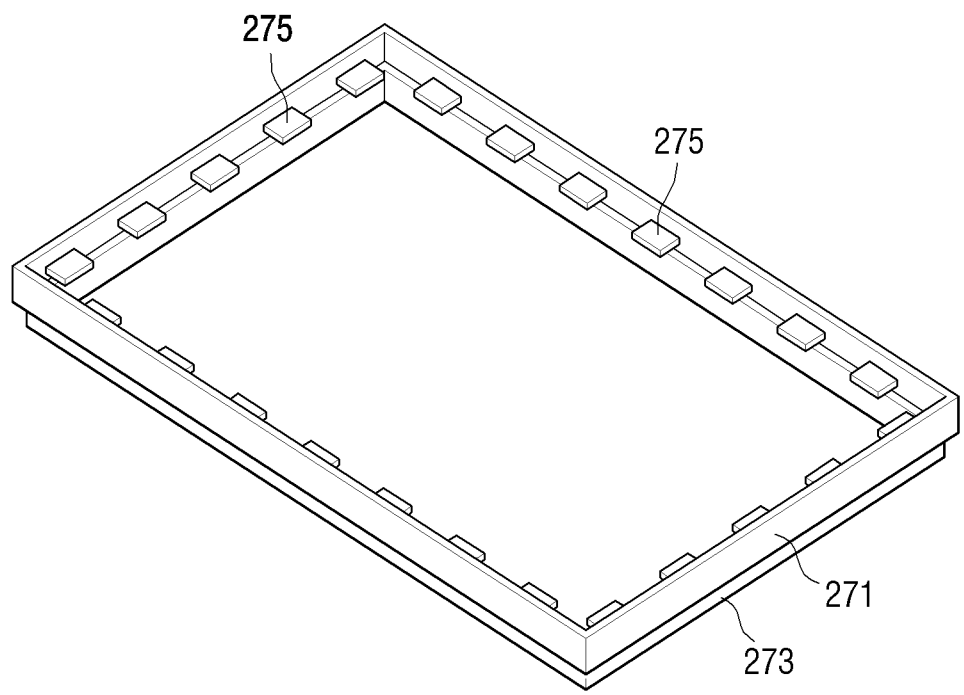
FIG. 9 is a perspective view illustrating a molding member of FIG. 6A.

Referring to FIGS. 8 and 9, a plurality of locking members 211 are disposed on a rear surface of the display panel 110 substantially along an edge at intervals. The plurality of locking members 211 may be formed in a substantially "⊏" shape to be connected with the plurality of connection protrusions 275. In this case, both ends 211*a* and 211*b* of each of the plurality of locking members 211 are fixed to predetermined areas S1 and S2 of the display panel 110 by bonding (for example, ultraviolet (UV) bonding).

As described above, in the curved display apparatus 100*a*, when the display panel 110 is fixed to the molding member 270, the plurality of connection protrusions 275 of the molding member 270 are inserted into the plurality of locking members 211. Accordingly, the display panel 110 in the flat state is pulled toward the molding member 270 which is curved with curvature corresponding to the curvature of the bottom chassis 150, such that the display panel 110 is maintained in a curved state with the substantially same curvature as that of the bottom chassis 150 as shown in FIG. 6A.

Figure 10A:
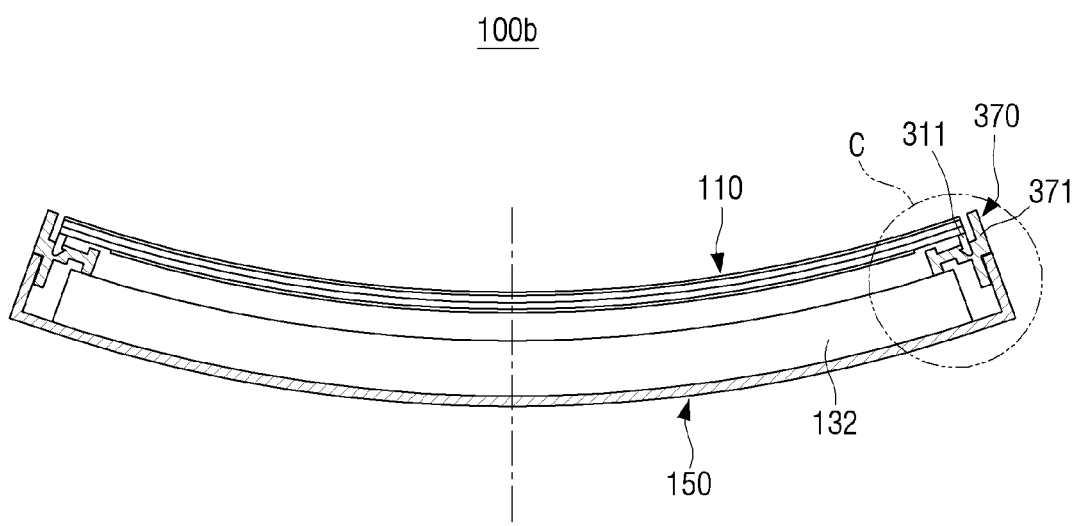
FIG. 10A is a cross section view illustrating a curved display apparatus according to an aspect of another exemplary embodiment.

Hereinafter, a curved display apparatus 100*b* according to another exemplary embodiment will be explained with reference to FIGS. 10A to 11. FIG. 10A is a cross section view illustrating a curved display apparatus according to another exemplary embodiment, and FIG. 10B is an enlarged view of a part "C" of FIG. 10A.

Most of the elements of the curved display apparatus 100*b* are similar to those described with reference to FIGS. 2-9. However, the curved display apparatus 100*b* differs from the curved display apparatus 100 in the structure for fixing the display panel 110. Therefore, the structure for fixing the display panel 110, which is different from that of FIG. 2A will be explained. The same elements as those of FIGS. 2A-9 use the same reference numerals and a detailed description thereof is omitted.

Figure 10B:
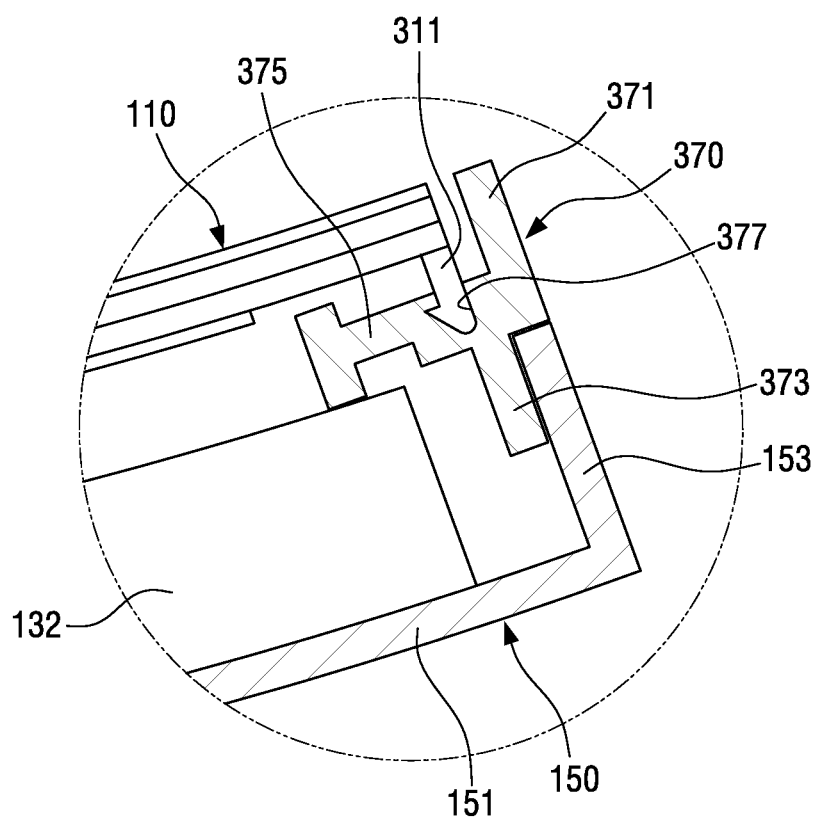
FIG. 10B is an enlarged view illustrating a part "C" of FIG. 10A.

Referring to FIGS. 10A and 10B, a plurality of hook members 311 protruding from a rear surface of the display panel 110 along an edge at intervals are provided. In this case, like the locking members 211 described above, each of the plurality of hook members 311 has one end fixed to a predetermined area of the rear surface of the display panel 110 by UV bonding.

A molding member 370 is disposed between the display panel 110 and the bottom chassis 150, and is made of a material having predetermined stiffness and also having flexibility. Therefore, the molding member 370 may be curved in a shape corresponding to curvature of the bottom chassis 150 when being connected with the bottom chassis 150 by a predetermined fastener (not shown). Also, the molding member 370 includes a first part 371 which has a shape substantially corresponding to an exterior of the bottom chassis 150, and a second part 373 which is extended from a lower end of the first part 371 by a predetermined length.

Figure 11:
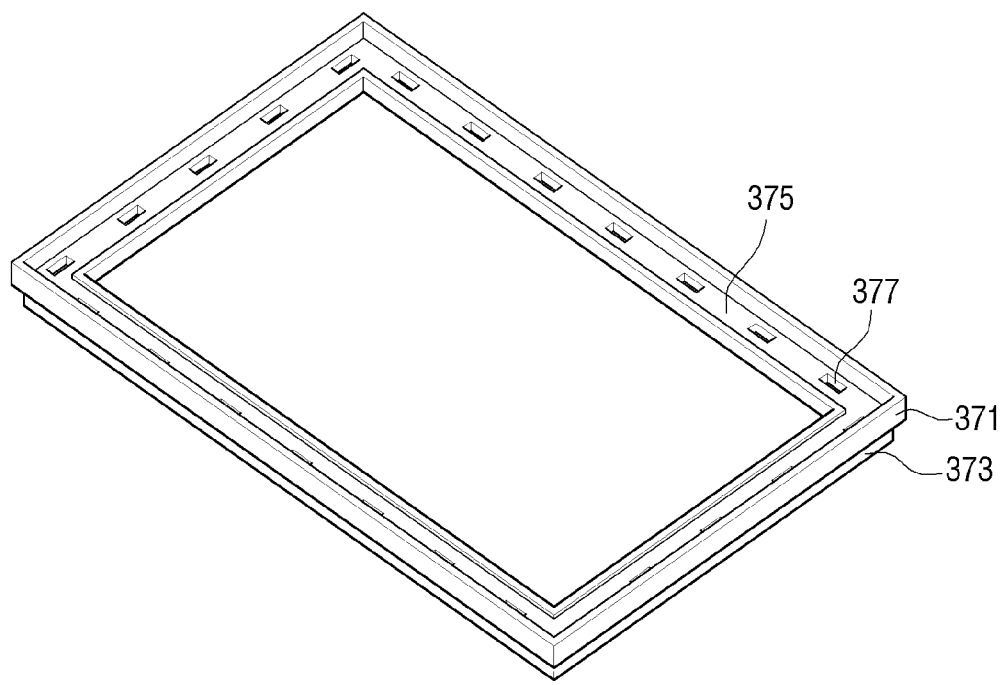
FIG. 11 is a perspective view illustrating a molding member of FIG. 10A.

Referring to FIG. 11, the molding member 377 includes a support rib 375 which protrudes from a part which substantially corresponds to a boundary between the first part 371 and the second part 373 inward the molding member 370 by a predetermined length. An end of the support rib 375 supports the light guide plate 132, and a plurality of connection recesses 377 are formed on a top surface of the support rib 375 so that the plurality of hook members 311 are snap-fitted into the plurality of connection recesses 377.

In the curved display apparatus 100*b* described above, when the display panel 110 is fixed to the molding member 370, the plurality of hook members 311 of the display panel 110 are snap-fitted into the plurality of connection recesses 377 of the molding member 370, respectively. Accordingly, the display panel 110 in the flat state is pulled toward the molding member 270 which is curved with curvature corresponding to the curvature of the bottom chassis 150, such that the display panel 110 is maintained in a curved state with the substantially same curvature as that of the bottom chassis 150 as shown in FIG. 10A.

Figure 12A:
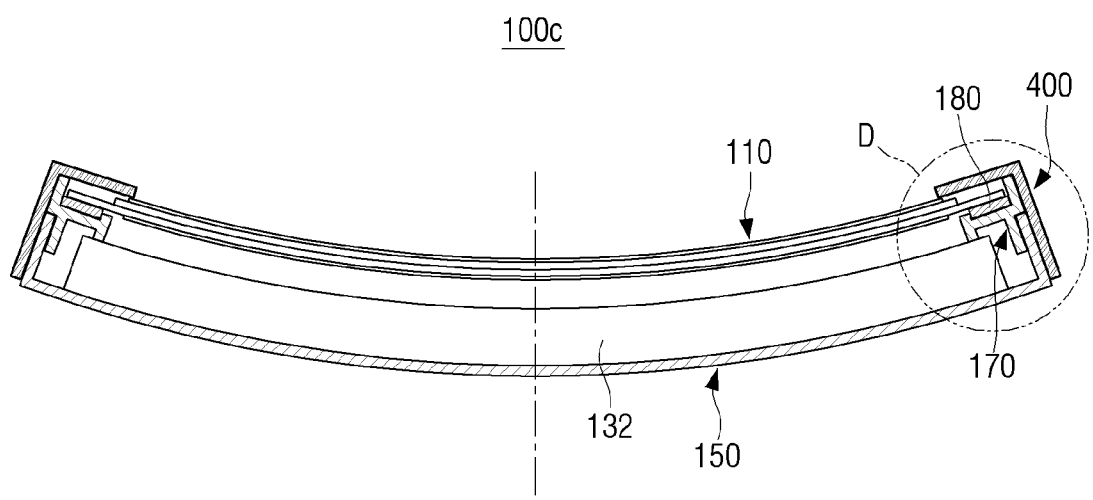
FIG. 12A is a cross section view illustrating a curved display apparatus according to an aspect of another exemplary embodiment.
Figure 12B:
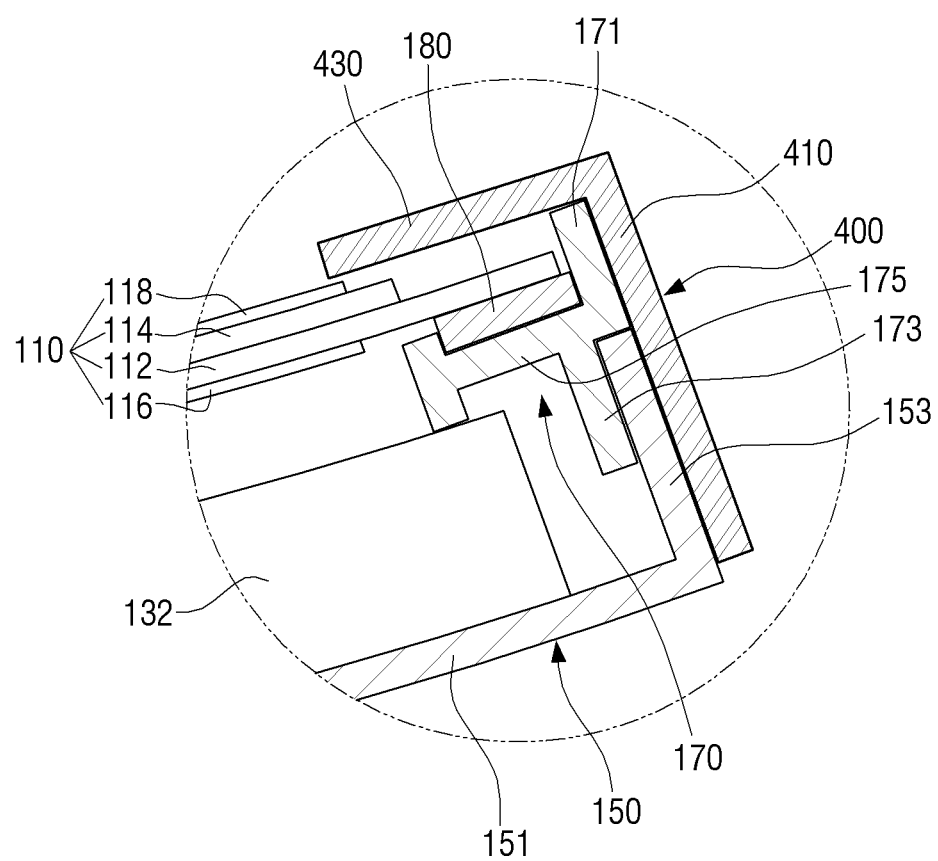
FIG. 12B is an enlarged view illustrating a part "D" of FIG. 12A.

Hereinafter, a curved display apparatus 100*c* according to another exemplary embodiment will be explained with reference to FIGS. 12A and 12B. FIG. 12A is a cross section view illustrating a curved display apparatus according to another exemplary embodiment, and FIG. 12B is an enlarged view of a part "D" of FIG. 12A.

Referring to FIG. 12A, most of the elements of the curved display apparatus 100*c* are similar to those described with reference to FIG. 2A, and the curved display apparatus 100*c* differs from the curved display apparatus 100 in that it further includes a top chassis 400. Hereinafter, the same elements as those of FIGS. 2A-11 use the same reference numerals, and a detailed description thereof is omitted.

In FIGS. 2A-11, the display panel 110 in which a stepped part is not formed on an edge is used. On the other hand, the curved display apparatus 100*c* employs a driving PCB of a COF type and thus the display panel 110 has a stepped part formed on an edge. Therefore, the curved display apparatus 100*c* further includes a top chassis (or a bezel) 400 to hide the stepped part of the display panel 110.

The top chassis 400 includes a first part 410 which is connected with outer surfaces of the side walls 153 of the bottom chassis 150, while enclosing them, and a second part 430 which is extended from the first part 410 inward the top chassis 400 in a substantially perpendicular direction.

Referring to FIG. 12B, the second part 430 of the top chassis 400 is formed to have such a length that it hides the entire stepped part. In addition, the second part 430 may be disposed with a minute gap with a front surface of the display panel 110. The second part 430 may be disposed just in contact with the display panel 110 without pressing the display panel 110.

In curved display apparatus 100c, the display panel 110 is pulled toward the molding member 170 and is fixed to the molding member 170 by the adhesive member 180. Accordingly, the display panel 110 maintains the substantially same curvature as that of the bottom chassis 150.

Figure 13A:
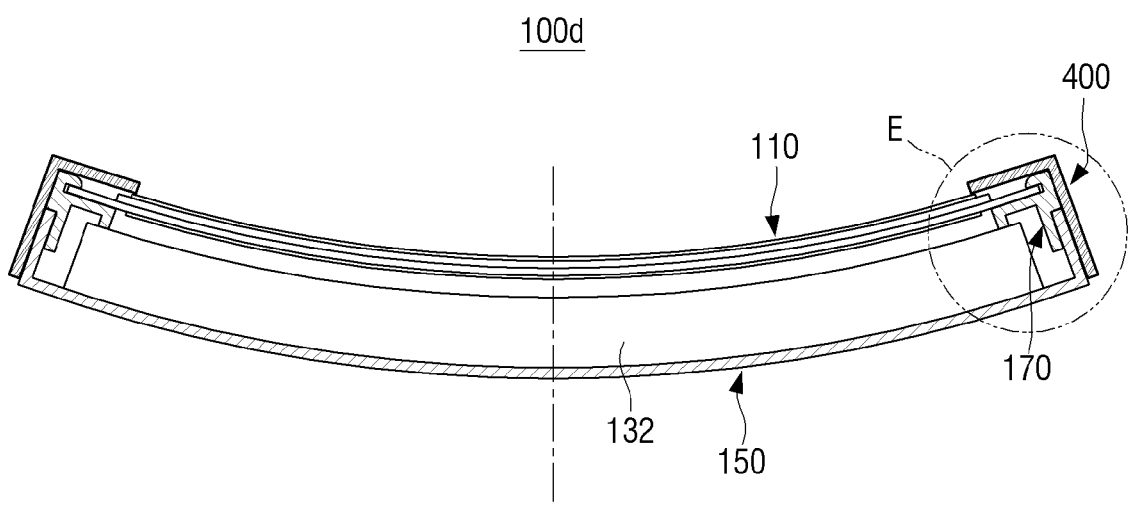
FIG. 13A is a cross section view illustrating a curved display apparatus according to an aspect of another exemplary embodiment.

Hereinafter, a curved display apparatus 100d according to another exemplary embodiment will be explained with reference to FIGS. 13A to 14. FIG. 13A is a cross section view illustrating a curved display apparatus according to another exemplary embodiment, FIG. 13B is an enlarged view illustrating a part "E" of FIG. 13A, and FIG. 14 is a perspective view illustrating a molding member of FIG. 13A.

Referring to FIG. 13A, the curved display apparatus 100d includes a top chassis 400 to hide a stepped part of the display panel 110. However, the curved display apparatus 100d differs from curved display apparatus 100c in the structure for fixing the display panel 110 with constant curvature. Hereinafter, the structure for fixing the display panel 110, which is different from that of curved display apparatus 100d, will be explained. The same elements as those of FIGS. 2A-12B use the same reference numerals and thus a detailed description thereof is omitted.

Figure 13B:
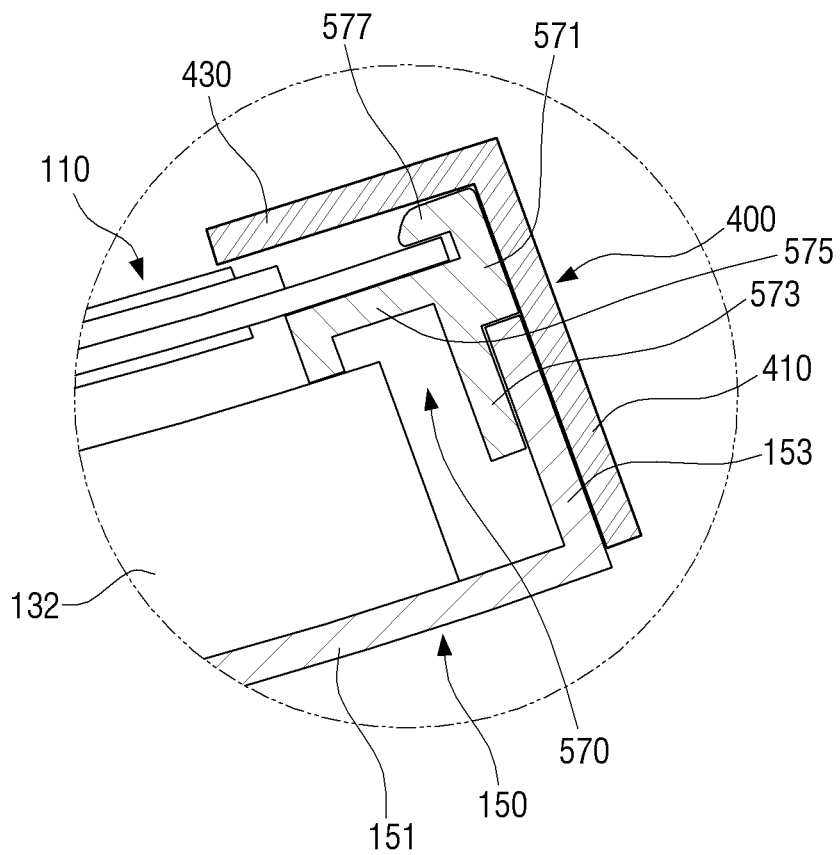
FIG. 13B is an enlarged view illustrating a part "E" of FIG. 13A.
Figure 14:
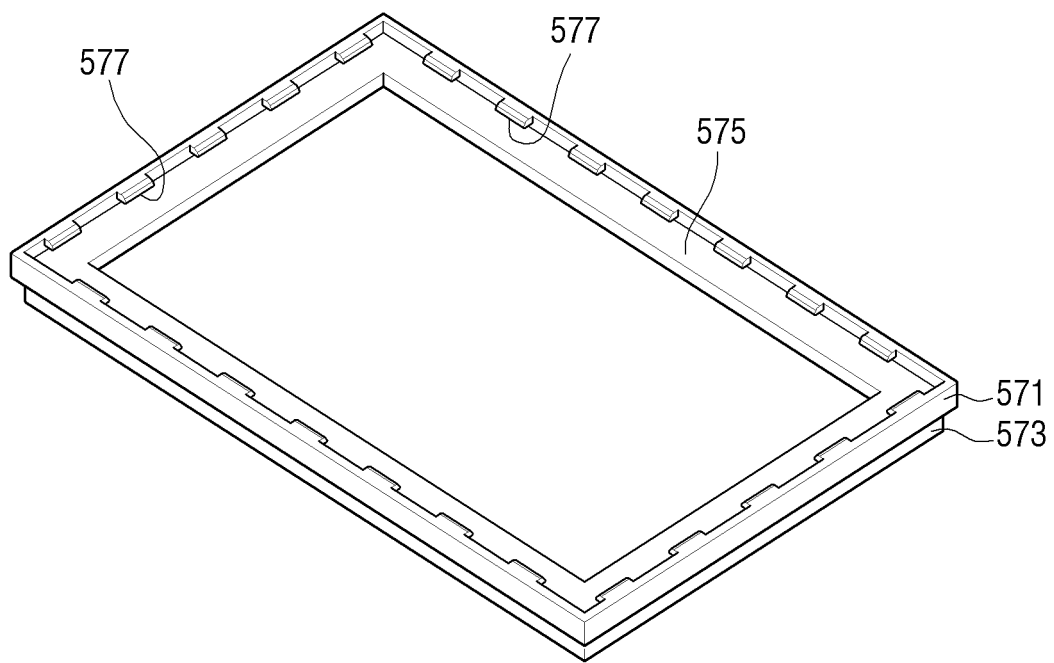
FIG. 14 is a perspective view illustrating a molding member of FIG. 13A.

Referring to FIG. 13B, a molding member 570 is made of a material having predetermined stiffness and also having flexibility. Therefore, if the molding member 570 is connected with the bottom chassis 150 by a predetermined fastener (not shown), the molding member 570 is curved in a shape corresponding to curvature of the bottom chassis 150. The molding member 570 includes a first part 571 which has a shape substantially corresponding to an exterior of the bottom chassis 150, and a second part 573 which is extended from a lower end of the first part 571 by a predetermined length.

The molding member 570 includes a support rib 575 which protrudes from a part which substantially corresponds to a boundary between the first part 571 and the second part 573 inward the molding member 570 by a predetermined length. An end of the support rib 575 supports the light guide plate 132.

Referring to FIG. 14, a plurality of fixing protrusions 577 are formed along an upper end of the first part 571 of the molding member 570 at intervals. The plurality of fixing protrusions 577 are extended from the upper end of the first part 571 inward the molding member 570.

In FIG. 14, the display panel 110 is fixed to the molding member 570 by the plurality of fixing protrusions 577 of the molding member 570 and the display panel 110 is pulled toward the molding member 570 and is fixed to the molding member 570. Accordingly, the display panel 110 maintains the substantially same curvature as that of the bottom chassis 150.

In curved display apparatus 100d, the fixing protrusions 577 are extended from the molding member 570. However, this should not be considered as limiting. The plurality of fixing protrusions may protrude from the upper end of the side walls 153 of the bottom chassis 150. In this case, the plurality of fixing protrusions formed on the side walls 153 may be formed to have such a length that they grip the edge of the display panel 110.

Although the curved display apparatuses 100, 100a, 100b, 100c, and 100d according to various exemplary embodiments are all landscape types, the curved display apparatuses may be portrait types.

As described above, the display panel 110 is maintained with the curvature so that a difference between a visual angle at the center and a visual angle at the left or right side can be overcome.

The foregoing exemplary embodiments and advantages are merely exemplary and are not to be construed as the present inventive concept. The exemplary embodiments can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A curved display apparatus comprising:
    a fixing member which is curved; and
    a display panel which is attached to the fixing member and curved along the fixing member,
    wherein the fixing member comprises:
        a bottom chassis which is curved; and
        a molding member which is flexible and connected with the bottom chassis in a curved state and to which the display panel is attached,
    wherein the display panel is detachable from the molding member, and
    wherein the molding member or the bottom chassis comprises a plurality of fixing protrusions which are attached to an edge of the display panel.

2. The curved display apparatus as claimed in claim 1, wherein the display panel is attached to the molding member by an adhesive.

3. The curved display apparatus as claimed in claim 2, wherein the adhesive comprises a double-sided tape disposed between the display panel and the molding member.

4. The curved display apparatus as claimed in claim 1, wherein the plurality of fixing protrusions are arranged along the edge of the display panel at intervals.

5. The curved display apparatus as claimed in claim 1, wherein a shape reinforcing structure is connected with the bottom chassis in order to prevent the curvature of the bottom chassis from being deformed.

6. The curved display apparatus as claimed in claim 5, wherein the shape reinforcing structure comprises a core which has a honey comb structure or a corrugation structure fixed to a bottom of the bottom chassis.

7. The curved display apparatus as claimed in claim 6, wherein the shape reinforcing structure further comprises a cover member to cover the core.

8. The curved display apparatus as claimed in claim 1, further comprising a top chassis which is connected to the bottom chassis and hides an edge of a top surface of the display panel.

9. The curved display apparatus as claimed in claim 1, wherein the fixing member is formed with a single curvature or multiple curvatures.

10. The curved display apparatus as claimed in claim 1, wherein the display panel is maintained with a single curvature or multiple curvatures.

11. The curved display apparatus as claimed in claim 1, wherein the display panel is an LCD panel or an OLED panel.

12. The curved display apparatus as claimed in claim 1, wherein the display panel is arranged in a landscape arrangement or a portrait arrangement.

13. The curved display apparatus as claimed in claim 1, wherein the display panel is flexible.

* * * * *